United States Patent [19]  [11] 4,130,424
Feit et al.  [45] Dec. 19, 1978

[54] PROCESS USING RADIATION CURABLE EPOXY CONTAINING RESIST AND RESULTANT PRODUCT

[75] Inventors: Eugene D. Feit, Berkeley Heights; Larry F. Thompson, Gillette, both of N.J.

[73] Assignee: Bell Telephone Laboratories, Incorporated, Murray Hill, N.J.

[21] Appl. No.: 812,231

[22] Filed: Jul. 1, 1977

Related U.S. Application Data

[63] Continuation of Ser. No. 712,394, Aug. 6, 1976, abandoned, which is a continuation-in-part of Ser. No. 408,927, Oct. 23, 1973.

[51] Int. Cl.² .............................................. G03C 1/71
[52] U.S. Cl. .................................... 96/35.1; 156/643; 156/901; 96/36.2; 96/115 R; 96/86 P; 204/159.13
[58] Field of Search ..................... 96/35.1, 36.2, 86 P, 96/115 R; 204/159.13, 159.14; 427/43; 156/643

[56]  References Cited
U.S. PATENT DOCUMENTS 3,916,035  10/1975  Brewer .................................. 96/36.2
3,931,435  1/1976  Gipstein et al. .................. 96/115 R

FOREIGN PATENT DOCUMENTS 48-14326  2/1973  Japan.

Primary Examiner—John D. Welsh
Attorney, Agent, or Firm—George S. Indig

[57]  ABSTRACT

Negative resist compositions are based on carbonaceous polymers with substituent branches containing epoxy groupings. Exemplary materials which include, for example, a copolymer of glycidyl methacrylate and ethyl acrylate in which epoxy groupings are unesterified show high sensitivity, for example, to electron radiation and to X-rays. Resolution is sufficient to permit expedient fabrication of detailed resist patterns for integrated circuits. High adherence permits use of acid or base reagents and thermal stability permits use of ion milling for circuit fabrication.

62 Claims, 3 Drawing Figures

PROCESS USING RADIATION CURABLE EPOXY CONTAINING RESIST AND RESULTANT PRODUCT

CROSS REFERENCE TO RELATED APPLICATION

This application is a continuation of application Ser. No. 712,394 filed Aug. 6, 1976, now abandoned which in turn is a continuation-in-part of application Ser. No. 408,927 filed on Oct. 23, 1973.

BACKGROUND OF THE INVENTION

1. Field of the Invention

The invention is concerned with polymeric coatings which are cured with particle or wave energy. A particular aspect of the invention is concerned with negative resist coatings in which patterns are generated by high energy radiation, such as, electron beam or wave energy of X-ray wavelength and shorter. Resist patterns of this nature may be utilized for protecting substrate regions from attack by a variety of agents or by other techniques used for circuit fabrication.

2. Description of the Prior Art

Fabrication of printed and integrated circuitry generally includes one or a series of processing steps in which surface regions are pattern delineated by selective material removal. Such removal, whether accomplished by use of chemical reagents, either acidic or basic, or by machining, for example, ion milling, utilizes masks or "resists". Such resists, generally adherent to the surface being processed, in accordance with this procedure define a negative image of the pattern to be delineated.

In accordance with general practice to date, resist patterns are generated in light sensitive coatings by flooding with ultraviolet light through a master mask in contact with or spaced from the coating, followed by development in an agent which differentiates between exposed and unexposed material. This procedure has been successfully utilized in the fabrication of patterns with reasonably low defect count and resolution as high as tens of microns separated by dimensions of the same order. See *Handbook of Thin Film Technology*, L. I. Marssel and R. Glang, Chapter 7 "Generation of Patterns in Thin Films" by R. Glang and L. V. Gregor, McGraw-Hill, N.Y. 1970. Resolution obtainable by light flooding is limited by a number of factors which diffraction and aberrations characteristic of conventional optical systems are examples. It has been recognized for some time that improved resolution would likely require development of a different system. Of the various systems investigated, the most promising at this time involves resist patterns generated by electron beams, modulated, for example, electrically and made to impinge directly on adherent radiation sensitive materials. The variety relevant to this discussion makes use of materials which are insolubilized by electron beam exposure. Alternative systems may substitute X-ray and/or may utilize masks. Where radiation sensitive layers are polymeric, insolubilization often takes the form of cross-linking. Subsequent to exposure, unexposed regions are dissolved, for example, by immersion in a suitable reagent.

A significant class of negative resist materials sensitive to electron beam or X-ray is described in "The Preparation and Characterization of a New, Highly Sensitive, Crosslinking Electron Resist" appearing in the *Journal of the Electrochemical Society* Vol. 122, No. 4, pages 541–544 (1975). This is an acrylate-based polymer system, generally a terpolymer of glycidyl methacrylic, ethyl acrylate, and methyl methacrylate in which epoxy moieties are totally or partially esterified with methacrylic acid. Preparation is involved, requiring a polymerization followed by a separate esterification and requiring close control at each step. Exposure of properly deposited coatings of this material results in cross-linking at reactive sites. Sensitivity is at least in part attributed to active vinyl sites produced by esterification. This material, considered by some to be marginally feasible from a preparative and an economic standpoint is, under optimum conditions, considered capable of producing patterns of usable yield with electron beam energy of less than $10^{-6}$ coulomb per square centimeter and with a resolution of the order of 1 micrometer.

SUMMARY OF THE INVENTION

A negative resist material useful for pattern generation on exposure to electron beam or short wavelength wave energy depends upon cross-linking of unmodified epoxy moieties, e.g., unesterified by methacrylic acid. In fact in economically preferred species cross-linking proceeds only through unesterified epoxy groupings contained in branches on a generally carbonaceous polymer chain. Such polymers, either homopolymers or copolymers, are conveniently produced by the addition polymerization of vinyl monomers. Working parameters are critically dependent on such considerations as molecular weight and molecular weight distribution, as well as on composition. Such considerations are set forth in detail under Sections 1 and 2 of the Detailed Description. Generally, epoxy-containing branches, necessarily unesterified, are present in amount of at least 20 percent of repeating monomer (or vinyl units) in the main polymer chain, or more generally in amount of at least 10 percent of carbon atoms in the main polymer chain. Epoxy groups are not attached directly to the chain but are separated by at least one atom, usually including a carbon atom. Direct attachment of epoxy moiety to the monomer vinyl grouping precludes orderly addition polymerization to result in a well-defined uncrosslinked polymer. In one exemplary composition, monomers include substituted or unsubstituted glycidyl methacrylates so that the epoxy grouping is attached to the chain through an ester moiety. Sensitivity of compositions of the invention is attributed to the epoxy groupings which remain unmodified during polymerization. Retention of unreacted epoxy groupings improves sensitivity and is economical as compared with procedures providing for esterification. For pedagogical reasons, it is convenient to discuss the invention in terms of Type I (aliphatic) materials, Type II (aromatic) materials, and, finally, Generic materials in that order.

A significant characteristic of the inventive coatings is concerned with the high yield of high resolution patterns. This characteristic, which derives from excellent adhesion, is, in turn, ascribed to a departure from past desiderata for Type I materials. Whereas, prior electron resist compositions for the general type of those of concern were in the past designed for use at temperatures at which the resist was primarily glassy, i.e., below the glass transition temperature ($T_g$), compositions of the invention are so designed as to have low values of $T_g$, thereby assuring exposure with the composition in its rubber state (the rubber state continues throughout the thermal $T_g$ range so that the inventive requirement for Type I prescribes use through or above $T_g$). To this end, compositional ranges are prescribed so as to minimize the presence of substituents which tend to make the compositions glassy at room temperature or at other temperatures of use. Other compositional considerations relevant to ease of preparation, as well as operational characteristics are set forth in the Detailed Description. Physically, layer thickness is determined by defect count and penetration length. Typically coatings are from 500 Angstroms to 4μm.

Type II materials, while sharing many of the properties of Type I materials (and while also dependent on cross-linking through unesterified epoxy groupings) are deliberately modified by inclusion of resonant groupings. Exemplary Type II materials have improved stability to ionizing radiation (e.g., experienced during ion implantation, ion milling, sputter etching etc. as in dry processing of semiconductor wafers). Such materials are characteristically glass phase and manifest somewhat reduced sensitivity to patterning radiation.

While wafer processing is generally contemplated, mask fabrication may utilize Type II materials to advantage. Halogenated resonant groupings offer some increase in patterning sensitivity without noticeable loss in stability and their incorporation results in a preferred Type II species.

Whereas the invention is primarily concerned with the composition of the resist material, other aspects defined by the appended claims include preparatory techniques, pattern delineation, and the final delineated product.

DETAILED DESCRIPTION

1. Composition

Figure 1:
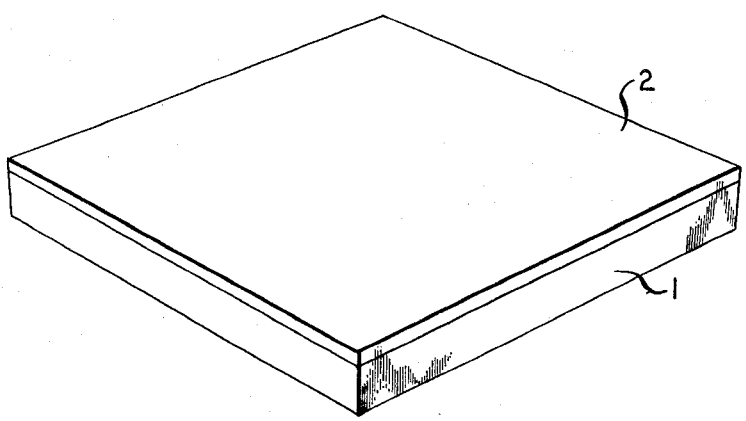
FIG. 1 is a perspective view of a substrate coated with a layer of an unexposed resist composition in accordance with the invention.

This parameter is discussed in terms of the uncured polymer coating--that is, the unexposed resist properly prepared for use. Residual initiator, solvent, and other ingredients utilized during preparation, as well as unintentional impurities, are not considered. First discussion is in terms of an unmodified polymer which, under usual circumstances, may be considered as constituting 99 percent by weight of the prepared coating. Further dilution, whether by intentional or unintentional ingredients, tends to impair significant operating characteristics, such as, resolution, adherence, defect count, etc., and so while permitted under some circumstances, is to be avoided for most discriminating use. Design modifications, made to shorten absorption length for X-ray or other energy utilized during pattern delineation, of necessity take the form of a change in the chemical nature of the polymer or of a physical admixture of an energy absorbent additive. These are separately discussed at the end of this section.

The polymer may be considered as being made up of repeating units in accordance with the general formula:

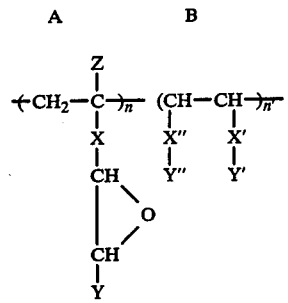

The formula is generalized so as to apply both to the copolymer case (n' = a finite number) and the homopolymer case (n' = 0). The polymer is conveniently prepared by addition polymerization; and, accordingly, monomers are vinyl. X is any grouping e.g., including from 1-4 carbon atoms (with associated hydrogens), other atoms such as O with or without carbons, N, S; it may take the form of the moiety:

X' is defined as including possible X members (e.g., simple alkyl substituents or an ester moiety). Y, Y', and Z, not necessarily identical, represent hydrogen or carbonaceous substituents containing from 0–4 carbon atoms (or associated hydrogens). X" is hydrogen of X" and Y" are optional members within the class of of X' and Y' members, respectively. The entire compound, characteristically as prepared by addition polymerization, is substantially ethylenically saturated.

The effective unit responsible for curing during exposure is the epoxy grouping:

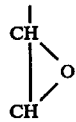

and it is a requirement of the invention that there be at least one such grouping for every five repeating units in the polymer chain or usually, at least one for every ten chain carbons. Stated differently, the n/(n + n') ratio must be at least 0.2. Absolute values of n and n' are not set forth but correspond with values required to result in a molecular weight of at least $10^3$. Polymers of increasing molecular weight above $10^6$ are attained with difficulty and, because of inconveniently decreasing rates of solubility in the uncured state, are generally undesirable from a processing standpoint.

Type I Materials

It is convenient to discuss certain compositional considerations in terms of the monomer/s. For these purposes, the first grouping of which there are $n$ units is designated A and the second grouping of which there are n' units is designated B. An exemplary A monomer is glycidyl methacrylate

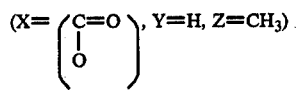

or acrylate (Z = H). Homopolymers produced from glycidyl methacrylate as an A monomer are not acceptable in accordance with the invention, since $T_g$ value is approximately 46° C—a temperature sufficiently high to assure the glassy state under most operating conditions. Where such an A monomer is utilized, it is necessary to reduce $T_g$ by copolymerization with a different vinyl monomer. Such a vinyl monomer B may, for example, be ethyl acrylate, or methyl acrylate, or any other permitted compound in accordance with the general formula may be used providing $T_g$ values are below processing temperature.

Certain monomers precluded in accordance with the general formula should be avoided. Certain other precluded substituents are avoided because of behavior upon exposure and accordingly, for example, halides may result in dehydrohalogenation and aromatic substituents impart radiation stability. Methyl methacrylates, as well as higher alkyl homologs, are avoided in B; and other groupings, such as, sulfones, all of which may result in cleavage, are avoided in the main polymer chain.

Type II Materials

These materials are again conveniently synthesized by addition polymerization for example using styrene as the B monomer. Accordingly X' may be phenyl, naphthyl or anthryl with or without substituents. Notable substituents are the halogens and Y' is symbolically representative of such element (although multiple substituents of halogens or other atoms is permitted). The definition of X' permits use of phenyl methacrylate as B monomer in accordance with an included example. Use of stilbene as B suggests definition of X" to include X' members. Y' and/or Y" may, in Type II compounds, supply the aryl substituent in lieu of X' and/or X". Such aryl substituents are defined as in X' and/or X".

The minimum number of aryl groupings for significant change in properties in one for every 20 chain carbons or about half the minimum prescribed for epoxy groupings. The maximum number is determined by intended use (e.g., practical high intensity or long time electron, X-ray or UV flood energy for delineating through a mask may permit relatively low patterning sensitivity and concomitant stability during subsequent use).

Generic

The generalized structural formula is useful as a pedagogical tool. Actual materials may be homopolymers; may be produced by condensation rather than addition etc. The generic requirements are primarily those of molecular weight; glycidyl groupings (number and separation from the main chain); and aryl groupings (Type II). Type I and II materials are intended to define a continuous composition range (e.g., fewer aryls than 0.05 based on chain carbons results in Type I material).

While the formula is in terms of an orderly two-membered copolymer the general requirements are met under other circumstances (e.g., A units non-identical; for Type II some aryl groups may be fused and/or halogenated—others not).

As above defined, all members of the included class are characterized by high sensitivity to electrons of a convenient energy range (e.g., from 3 kv to 30 kv). Where wave energy of X-ray energy or higher (wavelength = 15 nm or less) is to be utilized, it may be desirable to chemically modify the polymer or to admix additive so as to increase absorption for that form of energy. Convenient modification may take the form of inclusion of a vinyl monomer with a metal-containing substituent. Examples are organo-metallic compounds, such as vinyl ferrocene. Inclusion of up to 30 percent by weight of a metal-containing substituent is found to significantly increase absorption for X-rays without unduly diluting the epoxy-containing branches. Inclusion of such absorption-increasing substituent on an epoxy-containing branch does not affect cross-linking and may be included in greater amount.

2. Material Preparation

Type I Materials

Processing is discussed in terms of a copolymer. This is appropriate because (1) it involves the more complex case and (2) it involves questions pertaining to compositional adjustment with the objectives of adjusting $T_g$ and optimizing the parameter with, for example, sensitivity, etc. A simpler case is that of homopolymer preparation using a monomer which both results in appropriate sensitivity and in a sufficiently low value of $T_g$— e.g., polyglycidyl acrylate. While discussed in specific terms, all parameter considerations are exemplary. Design of a copolymer composition or for that matter selection of an appropriate homopolymer in accordance with the invention depends upon the same considerations, i.e., (1) assurance of operation in the rubber phase (that is, of all steps up to and including exposure); (2) adequate sensitivity to impinging radiation--compositions of the invention owe their sensitivity to the presence of unreactive epoxy groupings arranged in accordance with the general formula under Section 1 above and avoidance of aromatic substituents which impart stability to contemplated levels of radiation; and (3) in usual embodiments selection of monomers of such nature as to permit expedient polymerization by simple addition. Other considerations are set forth under Section 1 above.

A. Monomers, for example, glycidyl methacrylate and ethyl acrylate are obtained at a purity level of 99 percent or are processed, for example, by distillation to obtain this level of purity. Relative amounts of monomers are chosen so as to result in a value of $T_g$ which is below minimum temperatures during use. As an example, the relationship between $T_g$ in degrees C. and composition for the two stated monomers is set forth in tabular form:

| Percent Glycidyl Methacrylate | $T_g$ |
| --- | --- |
| 100 | 46 |
| 82 | 31 |
| 56 | 13 |
| 0 | −22 |

While exemplary, specific relative amounts in any copolymer are chosen in the same way. A first monomer, in this instance glycidyl methacrylate, contains the reactive epoxy grouping and is, therefore, primarily responsible for cross-linking upon exposure to radiation. This monomer is somehow disadvantageous and this disadvantageous property in minimized through copolymerization. So, for example, glycidyl methacrylate, due largely to the methyl substituent is a glassy material with the value of $T_g$ being above 40° C. when polymerized. The ethyl acrylate, relatively inactive upon irradiation (containing no epoxy groupings) has a relatively low $T_g$ (about −22° C. when polymerized) and is included in amount sufficient to reduce $T_g$ to an appropriate level. It is apparent that the composition chosen represents a compromise, and that, since sensitivity is impaired, the amount of the ethyl acrylate should be at a maximum level corresponding with the highest permitted value of $T_g$. Other comonomers may be included alone or in addition to effect other changes and, as discussed in the preceding section, one such purpose is to increase absorption for wave energy. Again, such a monomer, if it contains no active groupings, should be included in amount simply sufficient to assure sufficient improvement of the concerned parameter—in this instance, absorption. As discussed in the preceding section and as generally implicit in the specification, formulation setting forth monomer selection is such as to avoid substituents which lead to reactions competing either with initial polymerization or with cross-linking during exposure. Methyl methacrylate, for example, a well-known positive resist material, decomposes during exposure to electrons, and neither it nor any other monomer of similar tendency should be included. Methacrylic acid which esterifies the epoxy groupings leaving a vinyl group behind is to be avoided as an unnecessary processing step which increases cost and requires additional control to assure a properly defined product.

B. Polymerization is initiated by benzoyl peroxide or by other free radical initiators useful in addition polymerization. Considerations in the choice of such materials are set forth in *Polymer Handbook*, "Decomposition Rates of Organic Free Radical Initiators", article by J. C. Masson, J. Brandrup and E. H. Immergut, Eds., Interscience, (1966), pp. II-1 to II-54. Exemplary conditions are in the enumerated examples.

C. It has been noted that sensitivity and, to a lesser extent, other characteristics of the resist are dependent upon polymer weight. It is apparent that contrast, as well as other resist characteristics, are desirably characterized by narrow permitted ranges of relevant parameters. This gives rise to the desire to maintain a relatively narrow range of polymer weight. Both objectives are met by appropriate selection of polymerization conditions. Most significant is use of a chain transfer agent appropriate both in kind and amount. Methyl ethyl ketone is conveniently utilized in amount equal to or greater than that of the monomers and serves as solvent as well as chain transfer agent. Use of this material under exemplary processing parameters noted below results in a weight average molecular weight, $M_w$, range of from $10^3$ to $10^6$. In some instances, it may be desired to utilize an inert solvent together with a chain transfer agent. An example is benzene. In general, high viscosity of the monomer-solvent solution tends to increase the molecular weight distribution. It has been found that reaction mixture viscosities of about 40 centipoise or lower at the reaction temperature of 80° C. is desirable. Temperature of the reaction mixture is desirably increased both to accelerate polymerization and lower viscosity. Convenient temperatures range from 55° C. up to the boiling point.

Percent conversion again represents a compromise—this time between conversion efficiency and sensitivity on the one hand, and other considerations, such as solubility of the uncross-linked resist material and molecular weight distribution on the other. One hundred percent conversion corresponds with maximum molecular weight and, since but one cross-link per polymer molecule is required for curing, results in maximum sensitivity. Increasing viscosity with attendant increase in molecular weight distribution, thereby, decreasing contrast, results in prescription of a lesser conversion. It has been found convenient to operate at a conversion of 60 percent or less.

As an example, the following mixture was made up:

EXAMPLE 1

| 1. | Glycidyl methacrylate | 100 ml |
| 2. | Ethyl acrylate | 100 ml |
| 3. | Methyl ethyl ketone | 500 ml |
| 4. | Benzene | 500 ml |
| 5. | Benzoyl peroxide | 200 mg |

Reaction was carried out in an inert atmosphere such as nitrogen (presence of as little as 1 weight percent oxygen inhibits polymerization). The mixture was refluxed with external heating to result in a temperature of approximately 80° C. for a period of four hours. Conversion after this time was about 60 percent. Following, the polymer was precipitated into methanol, a non-solvent for the polymer but a solvent for other included material. In this way, solvent material including the chain transfer agent, as well as unreacted monomer, and initiator, were removed from the polymerized product. Other useful precipitation media include ethyl ether and petroleum ether.

Type II Materials

In general terms the discussion above is applicable. Exceptions involve $T_g$ which may be made high deliberately to minimize flow during dry processing or which may simply be of lesser significance for intended use. As discussed, patterning sensitivity usually less, may also be of less consequence.

The following procedure with obvious variations was followed in Examples 2 through 6 set forth in Table I. A 1000 ml resin reaction kettle was equipped with a teflon stirrer, condenser (with $N_2$ purge), thermometer, port for charging reactants, and heating mantle. The kettle was charged with 500 ml of benzene, 75 ml glycidyl methacrylate, 15 ml 4-chlorostyrene and heated to reflux. Refluxing was continued for 10-20 minutes to dispel any air and an $N_2$ purge connected to the reactor. 0.036 gm of benzoyl peroxide (BPO), used as an initiator, was dissolved in 25 ml of benzene and added to the refluxing mixture. Polymer yield was determined by withdrawing 5 ml of reaction mixture and precipitating in methanol in a weighed test tube. The polymer was allowed to coagulate, methanol removed, tube and polymer dried and weighed to determine polymer weight. The reaction was carried to ~40% conversion.

TABLE I

Polymeric and Lithographic Parameters For Materials Evaluated as Electron Resists

| Example | Monomer A | Monomer B | Weight % A | Mw $\times 10^{-4}$ | Molecular Weight Distribution | $D_g{}^i$ C cm$^{-2}$ $\times 10^7$ | Contrast |
|---|---|---|---|---|---|---|---|
| 2 | GA[1] | STY[2] | 26.1 | 5.7 | 1.6 | 220 | 1.1 |
| 3 | GMA[3] | STY | 71.3 | 15.5 | 2.2 | 14 | 0.9 |
| 4 | GMA | BrSTY[4] | 81 | 32 | 2.7 | 1.8 | 1.12 |
| 5 | GMA | ClSTY[5] | 64 | 16 | 2.3 | 4 | 1.2 |
| 6 | GMA | PMA[6] | 63 | 38 | 2.1 | 1.4 | 1.1 |

[1] GA - Glycidyl acrylate
[2] STY - Styrene
[3] GMA - Glycidyl methacrylate
[4] BrSTY - Monobromostyrene
[5] ClSTY - Monochlorostyrene
[6] PMA - Phenyl methacrylate

3. Characterization of the Resist

Type I Materials

Three physical properties characterize negative resist materials of the invention:

(1) low glass transition temperature $T_g$;

(2) high sensitivity to radiation—for example, electron, X-ray, etc.; and (3) high contrast (narrow response range to impinging radiation so as to sharply discriminate between irradiated and shadowed areas).

Resists are commonly applied to a substrate surface by a procedure including spinning and baking. Materials of the invention inherently possessed of low $T_g$ values need to be baked only to remove solvent. Low baking temperatures adequate to assure sufficient drying do not prematurely cross-link such materials. So, for example, baking at a temperature of 70° C. for 15 minutes is adequate to dry the usual 1 μm or less thick wetting layer and has no discernible effect on solubility. By contrast, prolonged heating, for example, for sixty minutes or longer at such a temperature, or shorter exposure to high temperature, for example, above 110° C., sometimes considered necessary to assure adherence of conventional high $T_g$ materials may cause premature curing. A prior art understanding dictating high $T_g$ considered refuted by this invention is expressed in 116, *Journal of the Electrochemical Society*, 980, (1969).

Operation in the rubber phase assures uniformly good adherence as contrasted with that of materials which are permitted to pass through or remain in their glass phase prior to or during exposure. This difference in adherence becomes increasingly important for defect-free high resolution patterns. So, for example, use of materials in accordance with the invention is less significant for patterns dependent upon 10 or 20 micrometers detail than those using one or two micrometers or even submicrometer structure.

Sensitivity is controlled by initial composition (i.e., number of epoxy moieties per repeating chain unit whether in a homo- or copolymer) and by the molecular weight of the polymer. Compositions of the general formula set forth in Section 1 above yield convenient values of $T_g$ for polymers of realistic molecular weight—i.e., $M_w = < 10^6$.

Molecular weight is controlled by the kinetics of chain transfer polymerization which, in turn, is dependent upon the ratio of monomer to chain transfer solvent and by the rate of initiator decomposition. These relationships, while complex and generally empirical, are well understood by those skilled in the art. Example 1 above under the conditions set forth, resulted in an intrinsic viscosity [η] of 0.46 and a molecular weight of about $1.5 \times 10^5$. The ingredients, but not the reaction conditions, were varied in Examples 2 and 3 above to result in the indicated values [η] and $M_w$.

EXAMPLE 7

| | | |
|---|---|---|
| 1. | Glycidyl methacrylate | 20 ml |
| 2. | Ethyl acrylate | 20 ml |
| 3. | Methyl ethyl ketone | 200 ml |
| 4. | Benzoyl peroxide | 400 mg |
| | {η} = 0.24 | $M_w \sim 0.4 \times 10^5$ |

EXAMPLE 8

| | | |
|---|---|---|
| 1. | Glycidyl methacrylate | 30 ml |
| 2. | Ethyl acrylate | 10 ml |
| 3. | Methyl ethyl ketone | 400 ml |
| 4. | Benzoyl peroxide | 400 mg |
| | {η} = 0.16 | |
| $M_w \sim 0.2 \times 10^5$ | | |

Figure 3:
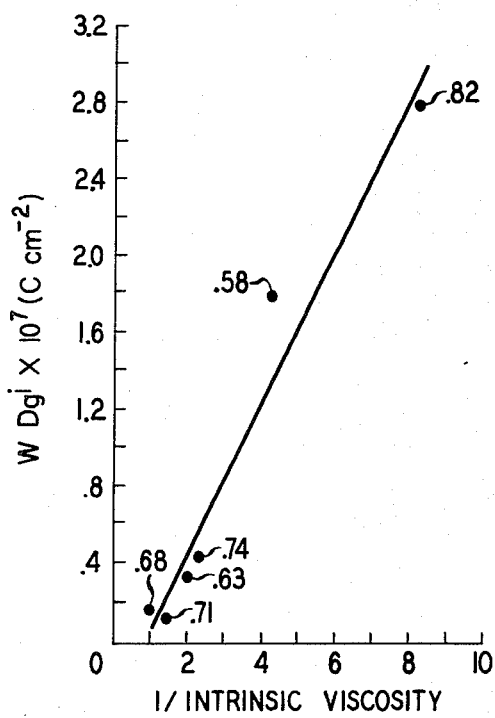
FIG. 3 on coordinates of dose in coulombs per square centimeter on the ordinate and reciprocal intrinsic viscosity on the abscissa, is a plot relating these two characteristics for the inception of cross-linking in a representative composition undergoing electron beam irradiation in accordance with the invention.

FIG. 3 shows the relationship between intrinsic viscosity and sensitivity. All six examples depicted on the figure were chosen as representing identical reaction conditions, all correspond with resist film thickness of 400-500 nanometers, and in each instance, irradiation was by 5 kV electron beam. Ordinate units required to initiate cross-linking are dose ($D_g{}^i$) factored by the mole fraction of the epoxy-containing monomer (glycidyl methacrylate) in the copolymer. The numbers set forth next to each of the six points on the plot represent this weight fraction. Abscissa values are those of reciprocal intrinsic viscosity. Since epoxy groupings are the active sites responsible for cross-linking and since it is known from other experiments that the percentage of cross-linking is linearly proportional to the number of epoxy groupings per repeating unit, ordinate units are normalized. The figure, therefore, clearly shows that as intrinsic viscosity increases, the dose necessary to cross-link the films decreases. Molecular weight is related to intrinsic viscosity as in "Viscosity—Molecular Weight Relationships" in *Polymer Handbook*, by M. Kurata, M. Iwana, and K. Kamada, Vol. IV, pages 1-72, J. Brandrup and E. H. Immergut, Eds., Interscience, (1966). This is a well-known result in radiation chemistry; see *Atomic Radiation and Polymers*, A. Charlesby, Pergamon Press, (1960).

The contrast of the resist, i.e., the sharpness of its response to changes in dose, is an important characteristic of the resist. A high contrast resist is less likely to be partially exposed by the flux of electrons scattered transverse to the beam direction before it is fully exposed by the flux in the beam direction. The contrast of the resist is a function of the molecular weight distribution of polymers. This distribution is conveniently described by the ratio of weight-average molecular weight to number-average molecular weight. (P. J. Flory, *Principles of Polymer Chemistry*, Chapter VIII, pages 318–345 Cornell University Press, Ithaca, N.Y. (1953)). The ratio is conveniently available from gel permeation chromatography. (E. P. Otocka, "Modern Gel Permeation Chromatography" in *Accounts of Chemical Research*, (October 1973)). Table 2 shows the dependence of contrast on the ratio. The contrast is defined as: the slope of the linear portion of the exposure cure which plots log dose against weight of the normalized film thickness.

Table 2

| Sample | Contrast | $M_w/M_n$ |
|--------|----------|-----------|
| 1 | 1.1 | 2.5 |
| 2 | 1.2 | 2.3 |
| 3 | 0.7 | 3.7 |
| 4 | 0.7 | 4.5 |
| 5 | 1.0 | 2.4 |
| 6 | 1.0 | 2.5 |

A narrow molecular weight distribution is available from chain transfer polymerization, such as is proposed for the preparation of these resists if conversion is kept to less than 60 percent.

Molecular weight distribution ($M_w/M_n$ values) of from 2.0 to 3.0 were obtained using the procedures as described above. Examples 1, 2, and 3 are reasonably representative in resulting in $M_w/M_n$ values of 2.4, 2.5, and 2.3, respectively. The weight fraction of the active constituent—i.e., of the epoxy-containing side branches—has been determined by quantitative nuclear magnetic resonance spectroscopy. Values so obtained were found to correlate with the initial ratio of monomers. From the inventive standpoint a molecular weight distribution of less than 5 assures usable contrast. This parameter is desirably minimized and a preferred maximum of 2.5 is easily attained.

Type II Materials

Again the general considerations above are applicable with the exceptions implicit in the arylsubstituted materials. $T_g$ values are typically above rather than below room temperature and for examples 2 through 6 ranged upwards of 50° C. (Example 2). Sensitivity is included on Table I as $D_g{}^i$ in units of coulombs/cm$^2$ required for initial gel retention after development.

4. Preparation and Exposure of Resist Coating

The following general procedure is fairly descriptive of a usable technique. Specific conditions—i.e., those used in developing data of FIG. 3—are set forth in Example 9 at the end of this section. Resist material is dissolved in a suitable solvent, such as, chlorobenzene and is filtered, for example, through a filter with a pore size of 0.2μm or less. A substrate surface is wetted by the solution. Good uniformity may result from spin coating at 500 to 10,000 rpm.

The coating is then baked to remove excess solvent. Equivalent results have been produced by baking in vacuum, in air, or in an inert atmosphere, such as, nitrogen. A suitable temperature range is from 50° C. to 100° C. for a period of from 5 to 30 minutes. This is not a critical step, and it is only necessary to produce a coating which is solvent-free without premature cross-linking. The parameter ranges noted are sufficient to assure drying without measurable cross-linking. Exposure may be carried out with X-ray wavelength of from 0.5 to 10 Angstrom units for periods dependent on absorption. Absorption may be increased to permit exposure periods as short as 1 minute at a wavelength of 2 Angstrom units. Electron beam velocity of from 3 to 30 kilovolts with an integrated dose of from $2 \times 10^{-7}$ to $2 \times 10^{-6}$ coulombs/square centimeter results in usable resist thickness. Retention of an entire film thickness of 1μm requires a dose of about $5 \times 10^{-6}$ coulombs/cm$^2$ of 10 kV electrons.

Development, that is dissolution of the unexposed portion of the film, may be carried out in any suitable solvent. Comparative examples reported herein were carried out with a 5:2 mixture of methyl ethyl ketone and ethanol. Development may be by simple immersion or by spraying. Images in accordance with the examples were produced in development times of from five to twenty seconds. Since the cross-linked film is substantially insoluble in suitable solvent systems, development times noted may be exceeded by a factor of 100 or more without significant impairment of contrast.

Developed images are post-baked primarily to improve adhesion (by removal of developer) and sometimes to increase cross-linking. The post-bake is even less critical than the initial baking, since exceeding temperature or time can only result in greater cross-linking. Temperatures of from 60°–130° C. for time periods of from 5 to 30 minutes are exemplary. Again, this baking step may be carried out in vacuum or inert atmosphere. Comparative examples were all post-baked at 80° C. for 15 minutes in vacuum.

Developed post-baked images were immersed in a variety of reagents and subjected to other influences to determine utility as resists. Exposure to acids, such as HF, HCl, and HNO$_3$ and to bases such as NaOH, NH$_4$OH, at temperatures as high as 50° C. for periods as long as 6 minutes had little or no visible effect. Ion milling for periods as long as 20 minutes with ions of 6 kv energy had no apparent effect on image quality. Test conditions are considered to be at least as severe as those encountered in known processing as applied to silicon integrated circuits, tantalum circuits, and other procedures in which high resolution masks are to be used.

As a final test of adhesion, developed images were stripped from the substrate by use of a hot chromic acid solution or by use of an oxygen plasma under 300 watts, 25 millitorr pressure. Some one of these stripping conditions is appropriate for removal of the developed image after it has served its resist function in circuit fabrication.

The description in this section was developed on the basis of Type I materials. It is applicable in its entirety except for electron dose. Exemplary Type II dose values are included in Table I.

EXAMPLE 9

A solution of the composition resulting from Example 1 was dissolved in chlorobenzene with 10 percent by weight solids and was filtered through a 0.2μm pore filter. A coating thickness of 0.5μm was produced by spin coating at approximately 2,500 rpm onto a substrate of 0.2μm silicon dioxide on silicon. The wet coating was prebaked at 70° C. for a period of 15 minutes leaving a dried layer thickness of 0.5μm. The dried coating was exposed to a programmed 10 kv electron beam having a cross section of < 1500 Angstrom units (determined by the diameter of the beam until drop-off to 1th/e of maximum energy). The incident beam was scanned at a rate resulting in an integrated dose of $5 \times 10^{-7}$ coulombs/square centimeter. The pattern and other conditions were such as to result in an image which contained elements of less than 1 micrometer dimensions. The image was developed in 5:2 mixture of methyl ethyl ketone and ethanol by spraying for ten seconds. This resulted in complete removal of unexposed portions of the resist material. Post-baking was carried out at 80° C. for 15 minutes in a vacuum of approximately 1 mm. The image was etched in a buffered HF acid and was also tested by exposure to ion milling with a beam energy of 6 kV and an integrated dose sufficient to completely remove the silicon dioxide layer. No visible change in defect count or contrast resulted. The image was then stripped from the substrate in hot (50° C.) chromic acid solution by immersion for 1 minute. The entire cross-linked portion of the resist was removed so baring the underlying surface.

5. The Figures

FIG. 1 is a simple perspective view showing a suitable substrate 1, for example, of elemental silicon, silicon oxide, tantalum, tantalum nitride, gold, tungsten, chromium, copper, an alloy such as Ni—Fe—Mo, a compound semiconductor GaAs, GaP, an oxidic material, e.g., of the garnet or spinel structure or garnet (since the inventive resist material withstands most useful reagents even including hot aqua-regia suitable substrate materials are virtually unlimited). An unexposed resist layer 2 is shown as a simple unbroken layer in intimate contact with substrate 1.

Figure 2:
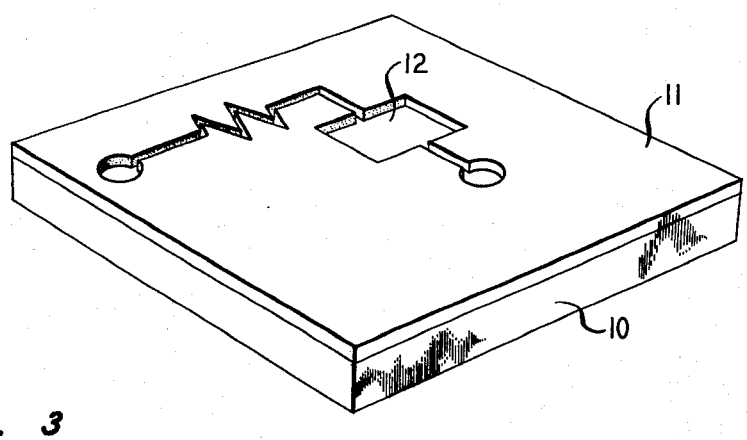
FIG. 2 is a perspective view of a substrate coated with a pattern delineated resist layer of a composition as described and processed in accordance with the invention.

FIG. 2 depicts the structure of FIG. 1 and includes substrate 10 and resist layer 11 after processing, for example, in accordance with conditions noted. The portion of layer 11 remaining has been cross-linked for example, by electron irradiation, by means of a preprogrammed electron beam. Removed portion 12 resulting after both exposure and development delineates a desired pattern.

FIG. 3 was discussed in conjunction with section 3 above.

5. Other Considerations

Appended claims recite or imply a number of considerations well known to those conversant with the concerned art. For example, it is recognized that electron beam resists are economically justifiable primarily where desired resolution is finer than that readily obtainable by photolithographic techniques. Accordingly, it is common practice to utilize focused electron beams capable of resolving desired detail. In present terms, this implies resolution limits of the order of a small number of micrometers or less and suggests the use of focused beams of the order of 1 micrometer or less. It is common practice to define the diameter of a beam of radiant energy in terms of the cross-sectional dimension through which the energy drop-off attains a minimum level of (1/e)th of the center energy.

While fine resolution is the usual justification for e-beam lithography, apparatus is sometimes utilized in other modes. For example, available apparatus may provide for larger focused beam cross-sections or even defocused beams so permitting ready delineation of pattern portions of larger dimension.

A recently developed procedure utilizes the photocathode which may be shaped so as to emit a desired pattern. Such a cathode which may emit electrons upon irradiation with X-ray or shorter wavelength wave energy is capable of high resolution pattern delineation when closely spaced from the resist layer. To this end, spacings may be 25 micrometers or less.

A significant aspect of the invention concerns the high degree of adherence to all substrate materials contemplated both in the uncured and cured state. This adherence in the cured state is pronounced upon exposure to any of the acidic or basic reagents normally utilized during erosion delineation. This adherence is also adequate for deposition modification of the substrate, for example, by electrolytic or electroless deposition.

The excellent adherence observed in the uncured state is attributed, in large part, to the rubber state of the polymer prior to curing. A ready measured parameter indicative of the temperature demarking the change in phase from the glassy to the rubber state is the thermal value of $T_g$. Since this parameter defines a second order transition, it is best described in terms of the temperature range ordinarily several degrees C. For the inventive purposes, it is found that the improvement in adherence attributed to the rubbery state continues from above $T_g$ to the low temperature limit of the thermal $T_g$ range. For most purposes, storage and use of the inventive product is at temperatures in excess of 22° C. For usual purposes, compositions of the invention are, in consequence, designed to have a low temperature limit of the $T_g$ range at this value. Under other circumstances, where operation can be expected to be carried out at lower temperatures or where it can reliably be expected that temperatures will not drop below some higher temperature, materials may be engineered accordingly. Under certain circumstances, where higher temperature operation is expected, it may be desirable to deliberately design the material to have a higher $T_g$ range. An example of such a circumstance is for the excemplary copolymer in which higher $T_g$, since indicating a larger proportion of the glycidyl grouping, results in increased sensitivity.

It is expected that the most significant commercial use of the inventive material will be in fabrication of printed or integrated circuitry. Other types of fabrication may be carried out with equal facility and the product may represent a similar advance over the prior art. So, for example, the inherently high permitted resolution and contrast ratio may permit fabrication of a high efficiency diffraction grating. Such a grating which may, for example, form a portion of an integrated optic circuit may be fabricated in silicon oxide, gallium arsenide, and polymer film materials, such as, plasma-deposited polyvinyl trimethyl silane.

Resist materials of the invention show the requisite sensitivity to permit direct fabrication of delineated resist on substrate surfaces upon which circuitry is to be formed. Compositions and methods described may be utilized as well for the preparation of hard copy masks which may subsequently be used for fabrication of many circuits, perhaps by conventional photolithography. A favored mask material at this time is a substrate-supported film of amorphous iron oxide which, through a variety of techniques, may be pattern delineated by simple development, for example, in dilute hydrochloric acid. This mask material is characterized by adequate contrast for the ultraviolet energy ordinarily used in photolithography and permits visual super-imposition with existing detail, since it is transparent in the visible spectrum. Other mask materials, such as, evaporated layers of chromium or, in fact, any material which may be etched in virtually any reagent may be utilized.

Efficacy of the materials of the invention depend upon the various parameters noted (these include molecular weight, molecular weight distribution) and require concentration of reactive epoxy groupings, etc. While the required uncured material has been defined in chemical terms, it may more broadly be defined as comprising a carbonaceous chain with substitutent branches, at least some of which contain epoxy groupings which are connected through the main polymer chain through at least one branch atom. The further specification that the polymer is substantially ethylenically saturated, in essence, provides that reactive groupings constitute primarily or solely epoxy groupings and precludes esterification of such groupings by methacrylic acid, as previously practiced.

Again this section is specifically descriptive of Type I materials. Except for $T_g$ and, sometimes, sensitivity considerations it is applicable to all materials of the invention.

The line between Type I and Type II materials should not be drawn sharply. Type II materials, particularly copolymers including bromo- or cloro-styrene are sufficiently sensitive for use on available e-beam primary pattern generators, and Type I materials have been successfully used in processing involving ion bombardment. A significant aspect of the inventive teaching is the availability of a variety of negative resist materials offering a variety of properties.

What is claimed is:

1. Article including a substrate provided with an intimately contacting coating of a radiation-sensitive negative resist material, said material consisting essentially of a polymer, said polymer comprising a carbonaceous chain with substituent branches at least some of which contain epoxy groupings which cross-link responsive to impinging radiation, characterized in that the said polymer is substantially ethylenically saturated; that the said polymer has a weight average molecular weight of about $10^3$ to $10^6$; that the said epoxy groupings:

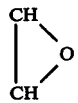

are connected to the main polymer chain through at least one branch atom; and that the molecular weight distribution of the said polymer defined as $M_w/M_n$, in which $M_w$ is the weight average molecular weight and $M_n$ is the number average molecular weight, is numerically equal to a value of less than 5.

2. Article of claim 1 in which the said polymer contains epoxy-containing branches in number at least equal to one such branch for every ten carbon atoms in the main polymer chain.

3. Article of claim 1 in which the temperature range defining the thermal glass transition $T_g$ has a lower temperature limit which is below the lowest temperature to be attained by the said article at any time prior to exposure to cross-linking radiation.

4. Article of claim 1 in which the said polymer is an addition polymer.

5. Article of claim 4 in which the said polymer is the polymerization product of monomer units at least some of which are substituted or unsubstituted glycidyl acrylate.

6. Article of claim 5 in which the said polymer is a copolymer and in which at least some of the monomer units are glycidyl methacrylate.

7. Article of claim 6 in which at least some of the monomers are ethyl acrylate.

8. Article of claim 1 in which the said polymer is a homopolymer.

9. Article of claim 1 in which the said polymer is a copolymer which may be regarded as being the polymerization product of at least two types of monomer at least one of which contains the epoxy-containing substituent branches as defined.

10. Article of claim 1 in which any non-glycidyl co-monomers as polymerized are characterized by a glass transition temperature range $T_g$ which is lower than that of a homopolymer of any glycidyl monomer.

11. Article of claim 1 in which the low temperature limit of the thermal $T_g$ range of the said polymer is below 22° C.

12. Article of claim 1 in which the said substrate comprises a semiconducting material.

13. Article of claim 12 in which the said semiconducting material is elemental.

14. Article of claim 13 in which the said elemental material is silicon.

15. Article of claim 12 in which the said semiconducting material is a compound semiconductor.

16. Article of claim 15 in which the said compound semiconductor is a binary intermetallic compound of a Group III and a Group V element in accordance with the periodic table of Mendelyeev.

17. Article of claim 1 in which at least a portion of the substrate surface with which the negative resist material makes intimate contact is oxidic.

18. Article of claim 17 in which at least a portion of the said substrate surface is an oxide of silicon.

19. Article of claim 1 in which at least a portion of the substrate surface with which the said negative resist material makes intimate contact is metallic.

20. Article of claim 1 in which the said polymer contains substituent groupings which increase the absorption for X-ray radiation.

21. Article of claim 20 in which the said substituent groupings contain ferrocene.

22. Article including a substrate to be pattern delineated provided with an intimately contacting coating of negative resist material, said material consisting essentially of a polymer consisting of a primarily carbonaceous chain with side branches containing radiation sensitive groupings which result in cross-linking, said sensitive groupings comprising epoxy groupings, characterized in that the polymer is of a composition represented by the formula:

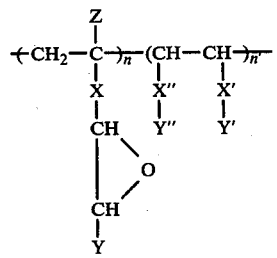

in which X is any grouping, X' is any grouping, Z, Y, and Y' are optional carbonaceous substituents containing from 0 to 4 carbon atoms, and X" is hydrogen or X" and Y" are optional substituents of the class represented by X' and Y', respectively, the said polymer being substantially ethylenically saturated, the said polymer having a molecular weight M of from about $10^3$ to $10^6$ in which said polymer the epoxy grouping

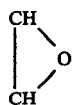

are present in a number of at least one such substituent for every ten carbon atoms in the main polymer chain, in which the molecular weight distribution is defined as $M_w/M_n$, in which $M_w$ is the weight average molecular weight and $M_n$ is the number average molecular weight, is less than 5, in which the glass transition temperature $T_g$ is below any temperature attained prior to exposure, said polymer being produced by a single step addition polymerization process in which monomers contain the side chains shown in the formula, in which the order of the groupings one designated by the subscript n and one designated by the subscript n' is random and in which the groupings designated by the subscript n and/or groupings designated by the subscript n', while necessarily falling within the chamical classification set forth, are not necessarily identical.

23. Article of claim 22 in which at least one of the substituents X', X", Y', and Y" is an aryl group selected from the group consisting of substituted and unsubstituted phenyl, naphthyl, and anthryl.

24. Article of claim 23 in which at least some of the said aryl groupings are halogenated.

25. Article of claim 24 in which halogenation is by at least one halogen selected from the group consisting of bromine and chlorine.

26. Article of claim 1 in which the said polymer contains aryl groupings in number at least equal to one such group for every twenty carbon atoms in the main polymer chain.

27. Article of claim 26 in which such aryl groupings are selected from the group consisting of substituted and unsubstituted phenyl, naphthyl, and anthryl groups.

28. Article of claim 27 in which at least some of such aryl groups contain at least one substituent halogen atom.

29. Article of claim 28 in which the said polymer contains epoxy-containing branches in number at least equal to one such branch for every ten carbon atoms in the main polymer chain and in which the said polymer contains aryl groupings in number at least equal to one such groupings for every twenty carbon atoms in the main polymer chain.

30. Article of claim 29 in which the said polymer is an addition polymer of monomers including substituted and unsubstituted styrene.

31. Article of claim 30 in which the said polymer is an addition polymer of monomers including substituted or unsubstituted glycidyl acrylate.

32. Article of claim 31 in which the said styrene is halogenated and in which the said acrylate includes glycidyl methacrylate.

33. Article of claim 32 in which the said styrene is selected from the group consisting of substituted or unsubstituted chlorostyrene and bromostyrene.

34. Article of claim 29 in which the temperature range defining the thermal glass transistion $T_g$ has a lower temperature limit which is above 22° C.

35. Article of claim 26 in which the said polymer contains substituent groupings which increase the absorption for X-ray radiation.

36. Process for pattern delineating a substrate surface on which there is a tightly adherent negative resist material comprising the steps of selectively exposing the said resist material to radiation with irradiated regions corresponding with a negative image of the pattern to be delineated on the substrate, so that the said radiation reduces the solubility of the said resist with respect to a developing reagent, in which the said resist material consists essentially of an uncured polymer having an epoxy grouping which is cured by impinging radiation, and subjecting irradiated resist material to the said developing reagent so as to selectively remove unirradiated portions thereof, following which a substrate together with a now pattern-delineated resist is subjected to a modifying influence for the said substrate thereby resulting in modification of substrate material in those areas bared during development, characterized in that the said uncured polymer is substantially ethylenically saturated; that the said polymer has a weight average molecular weight of about $10^3$ to $10^6$; that the said epoxy grouping

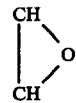

is connected to the main polymer chain through at least one branch atom; in that the said epoxy grouping is unmodified by esterification with methacrylic acid; and that the molecular weight distribution of the said polymer defined as $M_w/M_n$, in which $M_w$ is the weight average molecular weight and $M_n$ is the number average molecular weight, is numerically equal to a value of less than 5, and in that the said radiation is selected from the group consisting of ultraviolet wave energy, X-ray wave energy and electron radiation.

37. Process of claim 36 in which epoxy moieties are neither totally nor partially esterified with methacrylic acid.

38. Process of claim 36 in which the said modifying influence erodes the portions of the substrate bared during development.

39. Process of claim 38 in which erosion results from substrate attack by a chemical reagent.

40. Process of claim 38 in which the eroding influence is an ion beam.

41. Process of claim 36 in which the modifying influence results in deposition of material adherent at least to the portions of the substrate bared during development.

42. Process of claim 36 in which the radiation is electron radiation.

43. Process of claim 42 in which the radiation is a focused electron beam.

44. Process of claim 43 in which the beam diameter defined as the extremities of the beam within which the energy drop-off is a maximum of (1/e)th of the center energy is a maximum of 1 micrometer.

45. Process of claim 44 in which exposure results from a programmed scanning beam.

46. Process of claim 42 in which the radiation is a patterned array of electrons.

47. Process of claim 36 in which the said radiation is wave energy in the recited X-ray range.

48. Process of claim 47 in which exposure of selected areas results from passage of the said X-ray radiation through a mask.

49. Process in accordance with claim 36 comprising at least two sets of procedural steps as defined, said substrate comprising a semiconducting material.

50. Process of claim 49 in which at least a portion of the said substrate surface is oxidic.

51. Process of claim 36 in which at least a portion of the substrate surface at which the said resist makes intimate contact is an oxide of silicon and in which the said selected regions define the negative image of a diffraction grating.

52. Process of claim 36 in which the substrate comprises a semiconducting material in which at least a portion of the substrate surface with which the resist makes intimate contact is metallic and in which the said selected regions define a negative image of a circuit design.

53. Process of claim 36 in which the said polymer contains aryl groupings.

54. Process of claim 53 in which the said polymer contains at least one aryl grouping for every twenty chain carbon atoms.

55. Process of claim 53 in which the said aryl groupings are selected from the group consisting of halogenated and unhalogenated phenyl, napthyl, and anthryl.

56. Process of claim 53 in which the said modifying influence comprises ionizing radiation.

57. Process of claim 56 in which the said modifying influence defines sputter etching.

58. Process of claim 56 in which the said modifying influence defines ion milling.

59. Process of claim 56 in which the said modifying influence defines ion implantation.

60. Process of claim 53 in which the said impinging radiation defines an image of accelerated electrons delineated by passage through a mask.

61. Process of claim 53 in which the said impinging radiation defines an image of X-ray radiation delineated by passage through a mask.

62. The process of claim 53 in which the said polymer contains epoxy-containing branches in number at least equal to one such branch for every ten carbon atoms in the main polymer chain.

* * * * *

UNITED STATES PATENT AND TRADEMARK OFFICE
CERTIFICATE OF CORRECTION

PATENT NO. : 4,130,424
DATED : December 19, 1978
INVENTOR(S) : Eugene D. Feit and Larry F. Thompson It is certified that error appears in the above–identified patent and that said Letters Patent are hereby corrected as shown below:

Column 1, line 47, after "factors" insert --of--. Column 2, line 61, "for" should read --of--. Column 4, line 37, "of" should read --or--; line 38, delete "of", second occurrence. Column 5, line 47, "in" second occurrence should read --is--. Column 6, line 27, "the" should read --that--. Column 7, line 3, "in" should read --is--. Column 14, line 15, "rubber" should read --rubbery--; line 38, "excemplary" should read --exemplary--. Column 17, line 30, "chamical" should read --chemical--; line 58, "groupings" should read --grouping--. Column 20, line 18, "delinated" should read --delineated--.

Signed and Sealed this

Twentieth Day of May 1980

[SEAL]

Attest:

SIDNEY A. DIAMOND

Attesting Officer     Commissioner of Patents and Trademarks